(12) United States Patent
Koh et al.

(10) Patent No.: US 10,904,996 B2
(45) Date of Patent: Jan. 26, 2021

(54) SUBSTRATE SUPPORT WITH ELECTRICALLY FLOATING POWER SUPPLY

(71) Applicant: Applied Materials, Inc., Santa Clara, CA (US)

(72) Inventors: Travis Lee Koh, Sunnyvale, CA (US); Haitao Wang, Fremont, CA (US); Philip Allan Kraus, San Jose, CA (US); Vijay D. Parkhe, San Jose, CA (US); Daniel Distaso, Merrimac, MA (US); Christopher A. Rowland, Rockport, MA (US); Mark Markovsky, San Jose, CA (US); Robert Casanova, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 502 days.

(21) Appl. No.: 15/710,667

(22) Filed: Sep. 20, 2017

(65) Prior Publication Data

US 2019/0090338 A1 Mar. 21, 2019

(51) Int. Cl.
*H05H 1/34* (2006.01)
*H02N 13/00* (2006.01)
(Continued)

(52) U.S. Cl.
CPC ......... *H05H 1/34* (2013.01); *H01J 37/32082* (2013.01); *H01J 37/32697* (2013.01);
(Continued)

(58) Field of Classification Search
CPC .............. B01D 2201/295; B01D 27/08; B21C 37/0803; C23C 16/45565; C23C 16/458; C23C 16/4586; C23C 16/466; C23C 16/505; C23C 16/511; H01J 2237/334; H01J 37/321; H01J 37/32192; H01J 37/3244; H01J 37/32541; H01L 21/02274; H01L 21/2236; H01L 21/3065;
(Continued)

(56) References Cited

U.S. PATENT DOCUMENTS

| 5,770,023 A | 6/1998 | Sellers |
| 6,051,114 A | 4/2000 | Yao et al. |

(Continued)

FOREIGN PATENT DOCUMENTS

| JP | 2002-313899 A | 10/2002 |
| JP | 2016-225439 A | 12/2016 |
| KR | 10-2007-0098556 A | 10/2007 |

OTHER PUBLICATIONS

Dorf et al., U.S. Appl. No. 62/433,204, filed Dec. 12, 2016.
(Continued)

*Primary Examiner* — Tu B Hoang
*Assistant Examiner* — Vy T Nguyen
(74) *Attorney, Agent, or Firm* — Patterson + Sheridan LLP

(57) ABSTRACT

Embodiments described herein generally relate to plasma assisted or plasma enhanced processing chambers. More specifically, embodiments herein relate to electrostatic chucking (ESC) substrate supports configured to provide pulsed DC voltage, and methods of applying a pulsed DC voltage, to a substrate during plasma assisted or plasma enhanced semiconductor manufacturing processes.

19 Claims, 3 Drawing Sheets

(51) Int. Cl.
  *H05B 7/18* (2006.01)
  *H01J 37/32* (2006.01)
  *H01L 21/683* (2006.01)
  *H01L 21/67* (2006.01)

(52) U.S. Cl.
  CPC .. *H01J 37/32706* (2013.01); *H01J 37/32715* (2013.01); *H01L 21/6833* (2013.01); *H02N 13/00* (2013.01); *H05B 7/185* (2013.01); *H01L 21/67109* (2013.01); *H05H 2001/3494* (2013.01)

(58) Field of Classification Search
  CPC ......... H01L 21/67103; H01L 21/67109; H01L 21/6833; H01L 21/68742; H01L 21/6875
  USPC ....... 219/121.43, 121.54; 118/733, 724, 725; 156/345.52, 345.33, 345.34, 345.47, 156/345.48; 427/569; 204/192, 298
  See application file for complete search history.

(56) References Cited

U.S. PATENT DOCUMENTS

| | | | |
|---|---|---|---|
| 6,187,685 | B1 | 2/2001 | Hopkins et al. |
| 6,201,208 | B1 | 3/2001 | Wendt et al. |
| 6,253,704 | B1 | 7/2001 | Savas |
| 7,126,808 | B2 | 10/2006 | Koo et al. |
| 7,718,538 | B2 | 5/2010 | Kim et al. |
| 7,888,240 | B2 | 2/2011 | Hamamjy et al. |
| 8,382,999 | B2 | 2/2013 | Agarwal et al. |
| 8,383,001 | B2 | 2/2013 | Mochiki et al. |
| 8,603,293 | B2 | 12/2013 | Koshiishi et al. |
| 8,828,883 | B2 | 9/2014 | Rueger |
| 8,916,056 | B2 | 12/2014 | Koo et al. |
| 8,926,850 | B2 | 1/2015 | Singh et al. |
| 9,101,038 | B2 | 8/2015 | Singh et al. |
| 9,105,452 | B2 | 8/2015 | Jeon et al. |
| 9,150,960 | B2 | 10/2015 | Nauman et al. |
| 9,490,107 | B2 | 11/2016 | Kim et al. |
| 9,583,357 | B1 | 2/2017 | Long et al. |
| 9,601,319 | B1 | 3/2017 | Bravo et al. |
| 9,620,376 | B2 | 4/2017 | Kamp et al. |
| 9,728,429 | B2 | 8/2017 | Ricci et al. |
| 9,761,459 | B2 | 9/2017 | Long et al. |
| 9,852,889 | B1 | 12/2017 | Kellogg et al. |
| 9,881,820 | B2 | 1/2018 | Wong et al. |
| 2006/0075969 | A1 | 4/2006 | Fischer |
| 2008/0135401 | A1 | 6/2008 | Kadlec et al. |
| 2008/0160212 | A1* | 7/2008 | Koo ................. H01L 21/67069 427/569 |
| 2008/0289576 | A1 | 11/2008 | Lee et al. |
| 2010/0072172 | A1 | 3/2010 | Ui et al. |
| 2011/0281438 | A1 | 11/2011 | Lee et al. |
| 2012/0000421 | A1 | 1/2012 | Miller et al. |
| 2012/0088371 | A1 | 4/2012 | Ranjan et al. |
| 2014/0154819 | A1 | 6/2014 | Gaff et al. |
| 2014/0262755 | A1* | 9/2014 | Deshmukh ........ H01J 37/32431 204/192.35 |
| 2014/0263182 | A1 | 9/2014 | Chen et al. |
| 2014/0273487 | A1 | 9/2014 | Deshmukh et al. |
| 2015/0116889 | A1* | 4/2015 | Yamasaki .............. H02N 13/00 361/234 |
| 2015/0325413 | A1* | 11/2015 | Kim ................... H01J 7/32082 315/111.21 |
| 2016/0064189 | A1* | 3/2016 | Tandou ............. H01J 37/32192 156/345.33 |
| 2016/0322242 | A1 | 11/2016 | Nguyen et al. |
| 2017/0011887 | A1 | 1/2017 | Deshmukh et al. |
| 2017/0018411 | A1 | 1/2017 | Sriraman et al. |
| 2017/0069462 | A1 | 3/2017 | Kanarik et al. |
| 2017/0076962 | A1 | 3/2017 | Engelhardt |
| 2017/0098549 | A1 | 4/2017 | Agarwal |
| 2017/0110335 | A1 | 4/2017 | Yang et al. |
| 2017/0113355 | A1 | 4/2017 | Genetti et al. |
| 2017/0115657 | A1 | 4/2017 | Trussell et al. |
| 2017/0117172 | A1 | 4/2017 | Genetti et al. |
| 2017/0178917 | A1 | 6/2017 | Kamp et al. |
| 2017/0236688 | A1 | 8/2017 | Caron et al. |
| 2017/0236741 | A1 | 8/2017 | Angelov et al. |
| 2017/0236743 | A1 | 8/2017 | Severson et al. |
| 2017/0250056 | A1 | 8/2017 | Boswell et al. |
| 2017/0263478 | A1 | 9/2017 | McChesney et al. |
| 2017/0316935 | A1 | 11/2017 | Tan et al. |
| 2017/0330786 | A1 | 11/2017 | Genetti et al. |
| 2017/0334074 | A1 | 11/2017 | Genetti et al. |
| 2017/0372912 | A1 | 12/2017 | Long et al. |

OTHER PUBLICATIONS

Koh et al., U.S. Appl. No. 15/424,405, filed Feb. 3, 2017.
Dorf et al., U.S. Appl. No. 15/618,082, filed Jun. 8, 2017.
Wang, S.B., et al.—"Control of ion energy distribution at substrates during plasma processing," Journal of Applied Physics, vol. 88, No. 2, Jul. 15, 2000, pp. 643-646.
PCT International Search Report and Written Opinion dated Nov. 9, 2018, for International Application No. PCT/US2018/043032.

* cited by examiner

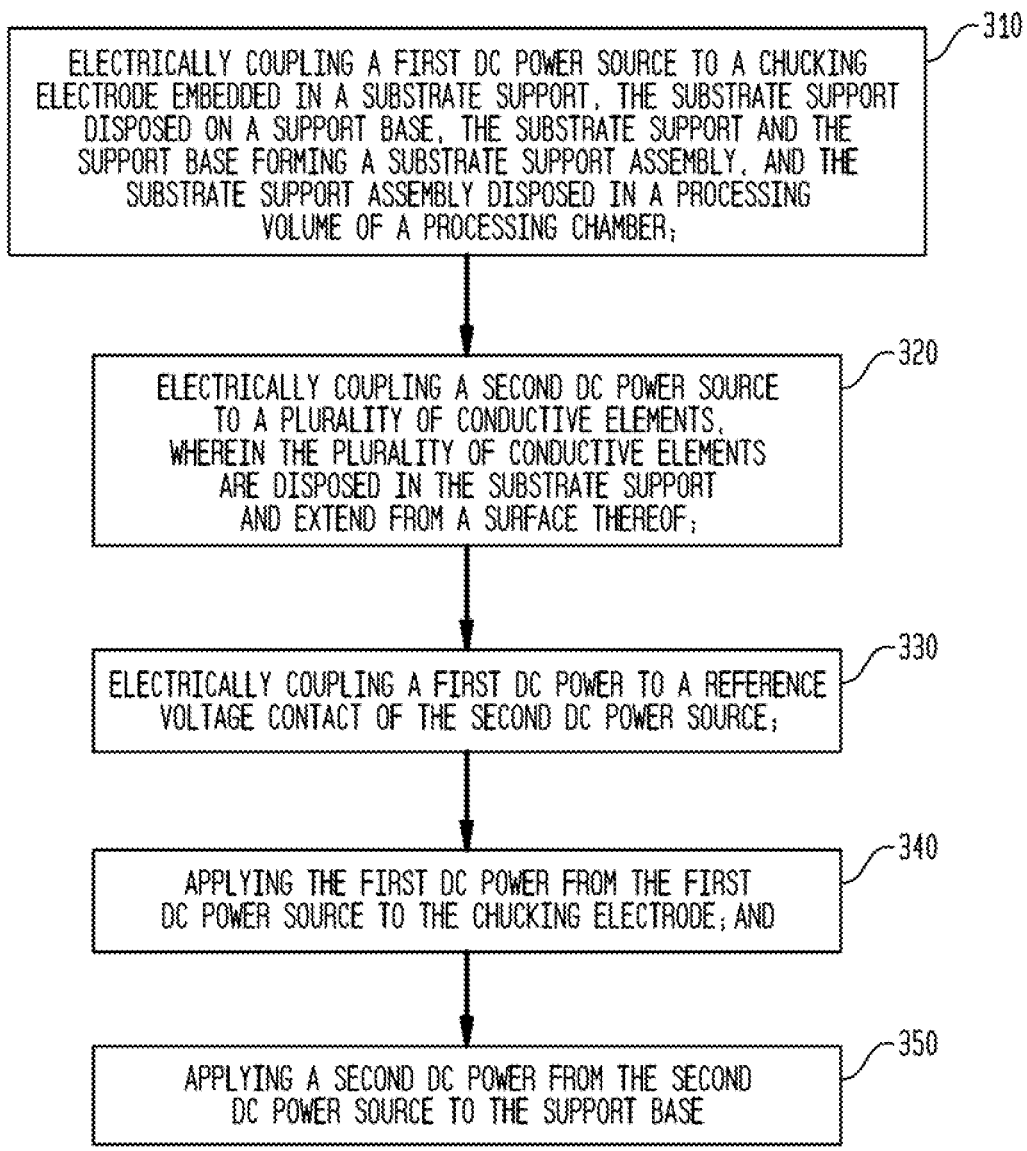

SUBSTRATE SUPPORT WITH ELECTRICALLY FLOATING POWER SUPPLY

BACKGROUND

Field

Embodiments described herein generally relate to processing chambers used in semiconductor manufacturing, in particular, to processing chambers having a substrate support assembly configured to bias a substrate disposed thereon, and methods of biasing the substrate.

Description of the Related Art

Reliably producing high aspect ratio features is one of the key technology challenges for the next generation of very large scale integration (VLSI) and ultra large scale integration (ULSI) of semiconductor devices. One method of forming high aspect ratio features uses a plasma assisted etching process to form high aspect ratio openings in a material layer, such as a dielectric layer, of a substrate. In a typical plasma assisted etching process, a plasma is formed in the processing chamber and ions from the plasma are accelerated towards the substrate, and openings formed in a mask thereon, to form openings in a material layer beneath the mask surface.

Typically, the ions are accelerated towards the substrate by coupling a low frequency RF power in the range of 400 kHz to 2 MHz to the substrate thereby creating a bias voltage thereon. However, coupling an RF power to the substrate does not apply a single voltage to the substrate relative to the plasma. In commonly used configurations, the potential difference between the substrate and the plasma oscillates from a near zero value to a maximum negative value at the frequency of the RF power. The lack of a single potential, accelerating ions from the plasma to the substrate, results in a large range of ion energies at the substrate surface and in the openings (features) being formed in the material layers thereof. In addition, the disparate ion trajectories that result from RF biasing produce large angular distributions of the ions relative to the substrate surface. Large ranges of ion energies are undesirable when etching the openings of high aspect ratio features as the ions do not reach the bottom of the features with sufficiently high energies to maintain desirable etch rates. Large angular distributions of ions relative to the substrate surface are undesirable as they lead to deformations of the feature profiles, such as necking and bowing in the vertical sidewalls thereof.

Accordingly, there is a need in the art for the ability to provide narrow ranges of high energy ions with low angular distributions at the material surface of a substrate during a plasma assisted etching process.

SUMMARY

The present disclosure generally relates to plasma assisted or plasma enhanced processing chambers. More specifically, embodiments herein relate to electrostatic chucking (ESC) substrate supports configured to provide pulsed DC voltage to a substrate disposed thereon during plasma assisted or plasma enhanced semiconductor manufacturing processes.

In one embodiment, a method of biasing a substrate with a pulsed DC voltage is provided. The method includes electrically coupling a first DC power source to a chucking electrode embedded in a substrate support assembly, where the substrate support assembly comprises a substrate support and a support base, and the substrate support assembly is disposed in a processing volume of a processing chamber. The method also includes electrically coupling a second DC power source to a plurality of conductive elements disposed in the substrate support and extending from a substrate support surface thereof. The method also includes electrically coupling a first DC power from the first DC power source to a reference voltage contact of the second DC power source, applying the first DC power from the first DC power source to the chucking electrode, and applying a second DC power from the second DC power source to the plurality of conductive elements.

In another embodiment, another method of biasing a substrate with a pulsed DC voltage is provided. The method includes forming a plasma in the processing chamber by flowing a gas into a volume therein and above the substrate support and applying a plasma power to a plasma electrode facing the substrate support. The method includes electrically coupling a first DC power source to a chucking electrode embedded in a dielectric material of a substrate support. The substrate support is disposed on, and is thermally coupled to, a support base, and the substrate support and the support base are disposed in a plasma processing chamber. The method also includes electrically coupling a second DC power source to a plurality of conductive pins disposed in the substrate support and extending from a surface thereof. The method also includes electrically coupling the first DC power from the first DC power source to a reference voltage contact of the second DC power source and applying a first DC power from the first DC power source to the chucking electrode. The method also includes applying a second DC power from the second DC power source to the plurality of conductive pins, the second DC power comprising a pulsed DC power having a frequency between about 10 Hz and about 100 kHz.

In another embodiment, a plasma processing apparatus is provided. The plasma processing apparatus includes a processing chamber having one or more sidewalls and a bottom defining a processing volume, a substrate support assembly disposed the processing volume, and a plasma generator disposed in the processing volume facing the substrate support. The substrate support assembly includes a support base, a substrate support formed of a dielectric material disposed on the support base and thermally coupled thereto, and a chucking electrode embedded in the substrate support. The substrate support assembly further includes a plurality of conductive elements disposed in the substrate support and extending from a surface thereof. In some embodiments, the plurality of conductive elements is electrically coupled to the support base through direct contact with therewith or through contact with a conductive resilient member disposed between the support base and the conductive pin. Herein, the plasma processing apparatus further includes a first power conduit configured to electrically couple the chucking electrode to a first DC power source, a second power conduit configured to electrically couple the plurality of conductive elements to a second DC power source, and a third power conduit configured to electrically couple the plasma source to a plasma power source. In some embodiments, the plasma generating system comprises a capacitively coupled plasma (CCP) source, an inductively coupled plasma (ICP) source, or a microwave plasma source, such as an electron cyclotron resonance plasma (ECR) source or a linear microwave plasma source (LPS). Typically, the plasma power source comprises an RF power source or a microwave power source.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3 is a flow diagram illustrating a method of biasing a substrate during plasma assisted or plasma enhanced processing, according to embodiments described herein.

DETAILED DESCRIPTION

Embodiments described herein generally relate to plasma assisted or plasma enhanced processing chambers. More specifically, embodiments herein relate to electrostatic chucking (ESC) substrate supports configured to provide pulsed DC voltage to a substrate, and methods of providing pulsed DC voltage to the substrate, during plasma assisted or plasma enhanced semiconductor manufacturing processes.

The embodiments described herein provide pulsed DC bias power directly to the substrate through electrically conductive elements disposed through the substrate support and extending beyond a surface thereof. The substrate, resting directly on or in direct contact with the conductive elements, is held in position for processing by an electrostatic chucking force. The electrostatic chucking force is provided by applying a chucking voltage from a chucking DC power supply to a chucking electrode embedded in the substrate support. The chucking DC power supply is electrically floating on an output contact of the pulsed DC bias power supply, such that the potential difference between the chucking electrode and the substrate is constant or nearly constant. Electrically floating the chucking DC power on the pulsed DC bias power supply provides a constant potential difference between the biased substrate and the chucking electrode, and therefore a constant clamping force therebetween.

Figure 1:
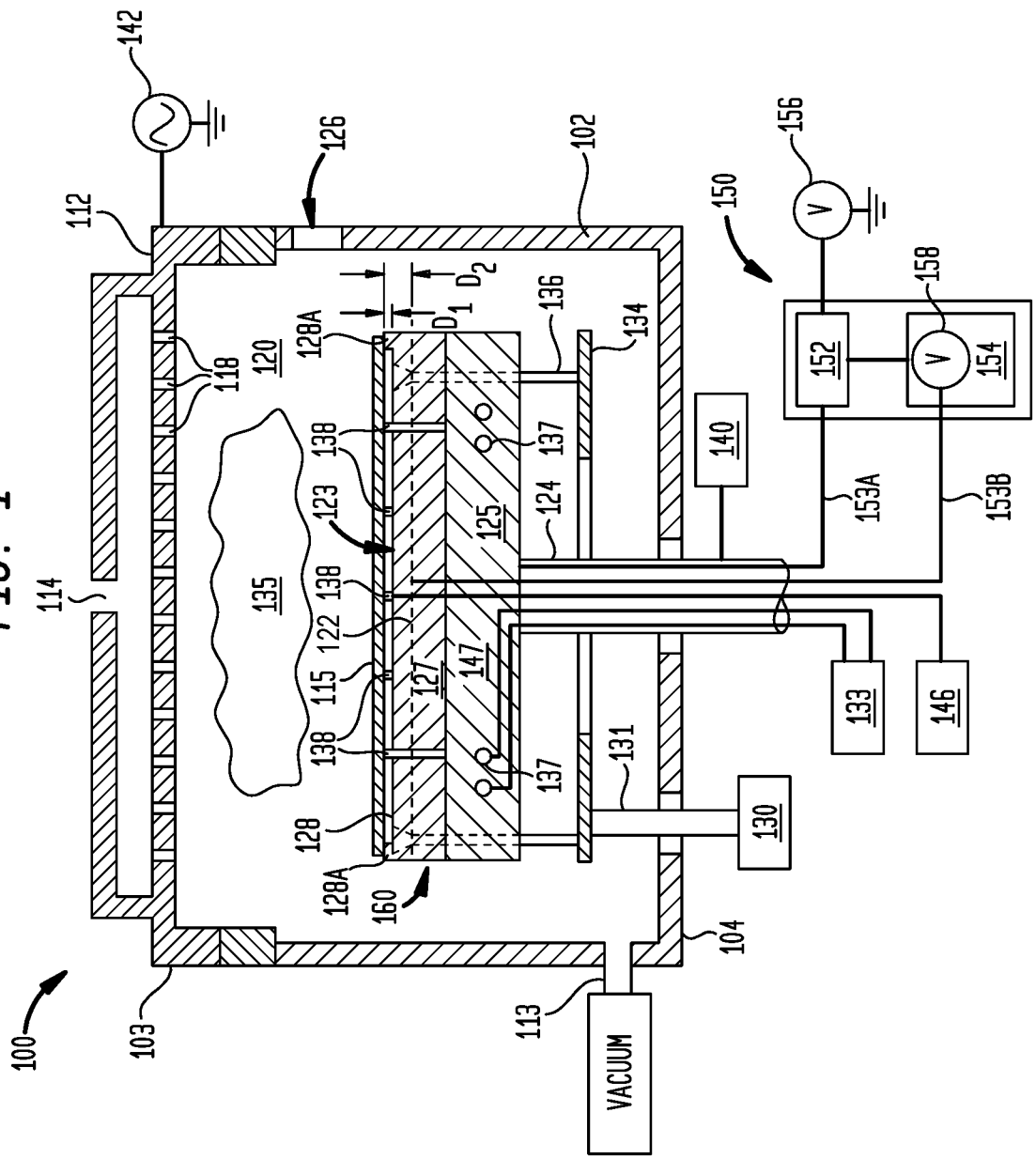
FIG. 1 is a schematic sectional view of a processing chamber having an electrostatic chucking (ESC) substrate support disposed therein, according to one embodiment.

FIG. 1 is a schematic sectional view of a processing chamber 100 having an electrostatic chucking (ESC) substrate support assembly 160 disposed therein, according to one embodiment. In this embodiment, the processing chamber 100 is a plasma processing chamber, such as a plasma etch chamber, a plasma-enhanced deposition chamber, for example a plasma-enhanced chemical vapor deposition (PECVD) chamber or a plasma-enhanced atomic layer deposition (PEALD) chamber, a plasma treatment chamber, or a plasma based ion implant chamber, for example a plasma doping (PLAD) chamber.

The processing chamber 100 features a chamber lid 103, one or more sidewalls 102, and a chamber bottom 104 which define a processing volume 120, and a plasma generator, such as a gas distributor 112 coupled to an RF power supply 142. Herein, the gas distributer, having a plurality of openings 118 disposed therethrough, is disposed in, or coupled to, the chamber lid 103 and is used to uniformly distribute processing gases from a gas inlet 114 into the processing volume 120. The gas distributor 112 is coupled to an RF power supply 142, such as a VHF power supply, for example a 162 MHz power supply, which forms a plasma 135 from the processing gases through capacitive coupling therewith. In other embodiments, the plasma generating system comprises an inductively coupled plasma (ICP) source electrically coupled to an RF power supply or a microwave plasma source, such as an electron cyclotron resonance plasma (ECR) source or a linear microwave plasma source (LPS) electrically coupled to a microwave power supply.

Typically, the processing volume 120 is fluidly coupled to a vacuum, such as to one or more dedicated vacuum pumps, through a vacuum outlet 113 which maintains the processing volume 120 at sub-atmospheric conditions and evacuates processing and other gases therefrom. A substrate support assembly 160, disposed in the processing volume 120 is coupled a support shaft 124 sealingly extending through the chamber bottom 104. The support shaft 124 is coupled to a first actuator 140 that raises and lowers the support shaft 124, and the substrate support assembly 160 disposed thereon, to facilitate processing of the substrate 115 and transfer of the substrate 115 to and from the processing chamber 100. Typically, when the substrate support assembly 160 is in a raised or processing position, the substrate 115 is spaced apart from the gas distributor 112 between about 0.2 inches and 2.0 inches, such as about 1.25 inches.

The substrate 115 is loaded into the processing volume 120 through an opening 126 in one of the one or more sidewalls 102, which is conventionally sealed with a or door or a valve (not shown) during substrate 115 processing. A plurality of lift pins 136 disposed above a lift pin hoop 134 are movable disposed through the substrate support assembly 160 to facilitate transferring of the substrate 115 thereto and therefrom. The lift pin hoop 134 is coupled to lift hoop shaft 131 sealingly extending through the chamber bottom, which raises and lowers the lift pin hoop 134 by means of an actuator 130. When the lift pin hoop 134 is in a raised position, the plurality of lift pins 136 extend above the surface of the substrate support 127 lifting the substrate 115 therefrom and enabling access to the substrate 115 by a robot handler. When the lift pin hoop 134 is in a lowered position the plurality of lift pins 136 are flush with, or below the surface of the substrate support 127 and the substrate 115 rests on a plurality of conductive elements 138 extending therethrough.

The substrate support assembly 160 herein includes a support base 125, a substrate support 127 thermally coupled to, and disposed on, the support base 125, and a plurality of conductive elements 138, disposed through the substrate support 127 that are electrically coupled to the support base 125. Typically, support base 125 of the substrate support assembly 160 is used to regulate the temperature of the substrate support 127, and thereby the substrate 115 disposed thereon, during processing and to provide pulsed DC power to the plurality of conductive elements. Herein, the support base 125 includes one or more fluid conduits 137 disposed therein that are fluidly coupled to, and in fluid communication with, a coolant source 133, such as a refrigerant source or water source. The support base 125 is formed of a corrosion resistant electrically and thermally conductive material, such as a corrosion resistant metal, for example aluminum, an aluminum alloy, or stainless steel. The substrate support 127 is typically formed from a dielectric material, such as a ceramic material, for example $Al_2O_3$, AlN, Y2O3, or combinations thereof. The substrate support 127 herein is thermally and fixedly coupled to the support base 125 with an adhesive or by suitable mechanical means. In other embodiments, the support base 125 is electrically isolated from the plurality of conductive elements 138 by a dielectric material disposed therebetween. In other embodiments, the support base 125 is not electrically conductive.

The substrate support assembly 160 provides for biasing of the substrate 115 and clamping of the substrate 115 thereto. The substrate 115 is biased through direct electrical contact with the plurality of conductive elements 138. The plurality of conductive elements 138 are disposed through the substrate support 127 and are electrically coupled to the support base 125. Typically, the plurality of conductive elements 138 are formed of a corrosion resistant electrically conductive material, such as aluminum, an aluminum alloy, silicon carbide, or combinations thereof.

The substrate 115 rests on, and makes direct contact with, the plurality of conductive elements 138 during processing. In the embodiment of FIG. 1, the conductive elements 138 are pins fixedly coupled to the substrate support assembly 160 and extending from the dielectric material of the substrate support surface 128 a first distance $D_1$ between about 1 µm and about 10 µm, such as between about 3 µm and about 7 µm, for example about 5 µm. The substrate 115, spaced apart from the substrate support surface 128 by the first distance $D_1$, is securely held to the plurality of conductive elements 138 by a clamping force from a chucking electrode 122 embedded in the dielectric material of the substrate support 127. Herein, the chucking electrode 122 comprises one or more continuous electrically conductive material parts, such as a mesh, foil, ring, or plate planarly disposed along a plane parallel with the substrate support surface 128. The chucking electrode 122 is electrically isolated from the plurality of conductive elements 138 by openings in the electrically conductive material part and by the dielectric material of the substrate support disposed between the chucking electrode and the plurality of conductive elements 138. The chucking electrode herein is spaced apart from the substrate support surface 128 by a second distance $D_2$ between about 100 µm and about 300 µm.

Typically, the substrate support surface 128 has a sealing lip 128A concentrically disposed thereon, and proximate to an outer circumference thereof, where the sealing lip 128A is formed of the dielectric material of the substrate support 127. When the substrate 115 is clamped to the substrate support 127, the substrate 115, substrate support surface 128, and sealing lip 128A define a plenum 123. During processing, ion bombardment will undesirably heat the substrate 115. Because the low pressure of the processing volume 120 results in poor thermal conduction between the substrate 115 and the substrate support surface 128 an inert thermally conductive gas, such as helium is provided to the plenum 123 from a gas source 146. The gas thermally couples the substrate 115 to the substrate support surface 128 and increases the heat transfer therebetween. Typically, the gas pressure in the plenum 123 is between about 1 Torr and about 100 Torr, such as between about 10 Torr and about 20 Torr.

In another embodiment, one or more of the conductive elements 138 are coupled to a resilient member (not shown) disposed the substrate support assembly 160. In this embodiment, the substrate support surface 128 has a plurality of mesas (not shown) protruding therefrom. When the substrate 115 is clamped to the substrate support 127 the conductive elements 138 are pressed towards the support base 125 and, through an upward force provided by the resilient member, are forced into good electrical contact with the substrate 115 disposed thereon. The substrate 115 is spaced apart from the substrate support surface 128 by the plurality of mesas thereby defining the plenum 123. In other embodiments, resilient members (not shown) are disposed between each of the plurality of conductive elements 138 and the support base 125. In other embodiments, one or more of the plurality of conductive elements 138 are formed of compressible springs.

In FIG. 1, the support base 125 is electrically coupled to a bias controller 152 disposed in a power control rack 150 by a first DC power conduit 153A. The bias controller 152 includes a solid state pulser/switcher that is electrically coupled to a first DC power supply 156. The first DC power supply 156 provides a high voltage (HV) DC power of between about 0 kV and about −10 kV, and the bias controller 152, through the solid state pulser/switcher, converts the HV DC power to a cyclic (pulsed) DC voltage having a frequency between about 10 Hz and about 100 kHz, such as between about 1000 Hz and about 50 kHZ. The pulsed DC voltage provides a pulsed DC bias to the substrate 115 through direct electrical connection therewith. In other embodiments, where the plurality of conductive elements 138 are electrically isolated from the support base 125, the first DC power conduit 153A is disposed through the support base 125, and electrically isolated therefrom, and is electrically coupled to each of plurality of conductive elements 138.

The chucking electrode 122 is electrically coupled to an electrically floating voltage source 154 disposed in the power control rack 150 by a second DC power conduit 153B. The electrically floating voltage source 154 is electrically coupled to the bias controller 152 which provides a reference voltage thereto. The electrically floating voltage source 154 includes a second DC power supply 158 that provides a chucking voltage to the chucking electrode 122. The second DC power supply 158 electrically floats on the pulsed DC voltage from the bias controller 152 to provide a constant voltage difference between the DC chucking voltage 188 provided to the chucking electrode 122, embedded in the substrate support 127, and the pulsed DC voltage (the reference voltage) provided to substrate 115. Herein, the chucking voltage is be between about 0 V and about 5000 V more than the pulsed DC voltage, such as between about 500 V and about 4500 V, such as between about 1000 V and about 3000 V, for example about 2500V.

Figure 2A:
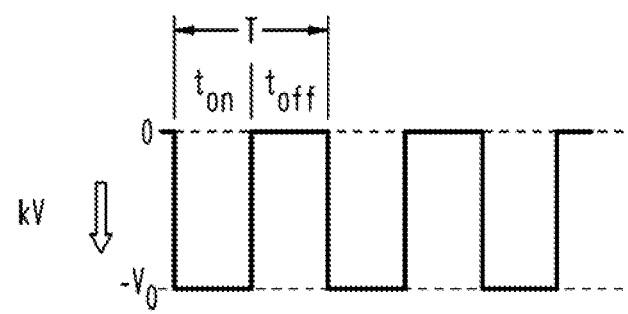
FIG. 2A illustrates a pulsed DC voltage.
Figure 2B:
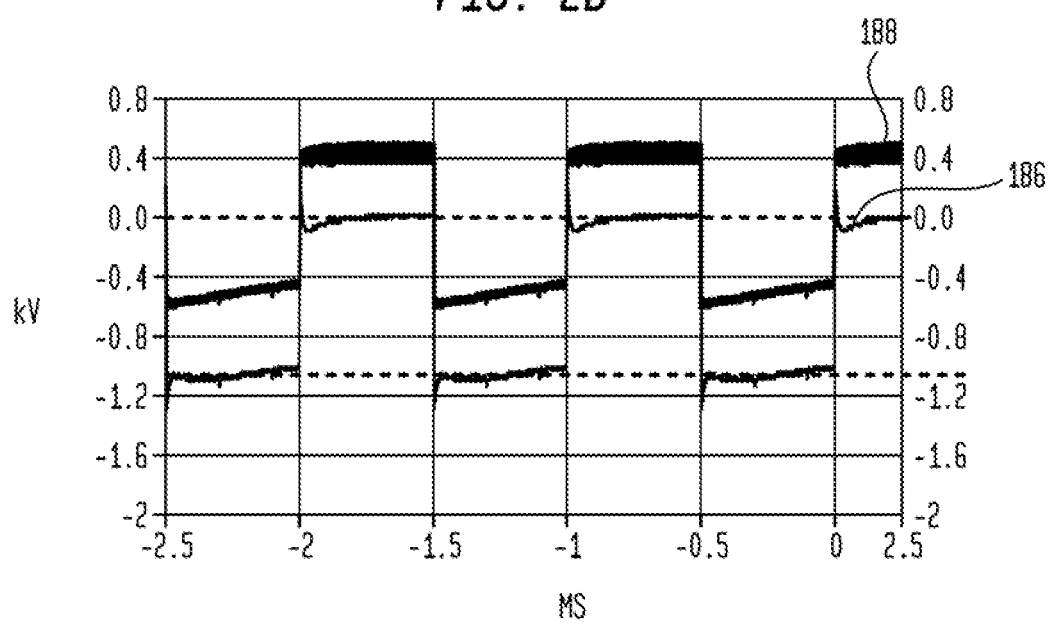
FIG. 2B illustrates a DC chucking voltage electrically floating on a pulsed DC voltage during the processing of a substrate disposed on a substrate support in a plasma processing chamber, such as the processing chamber shown in FIG. 1.

FIG. 2A illustrates a pulsed DC voltage, such as the pulsed DC voltage 186 shown in FIG. 2B, provided by a bias controller, such as the bias controller 152 shown in FIG. 1, where the pulsed DC voltage cycles from 0 volts to —$V_0$ having a pulse active time $t_{on}$, an off time $t_{off}$, and a cycle period T. Herein, the duty cycle (the percentage $t_{on}$ of the cycle period T) of the cyclic pulsed DC voltage is between about 10% and about 90%, such as between about 25% and about 75%, for example about 50%.

FIG. 2B illustrates a DC chucking voltage 188 electrically floating on a pulsed DC voltage 186 during the processing of a substrate disposed on a substrate support in a plasma processing chamber, such as the processing chamber 100 shown in FIG. 1. For this operation, the processing volume of the processing chamber was maintained at 150 mTorr and a plasma was formed from an argon gas coupled to a 500 W, 162 MHz power supply by an electrode facing the substrate support. The pulsed DC voltage 186, provided to the plurality of conducting elements and the substrate disposed thereon and in direct contact therewith, cycled between 0 V and −1000 V at a frequency of 1 kHz and a duty cycle of 50%. The DC chucking voltage 188, provided to a chucking electrode disposed in the substrate support, electrically floats on the pulsed DC voltage 186 to provide a constant potential of 500 V between the substrate and the chucking electrode to generate a constant clamping force therebetween.

FIG. 3 is a flow diagram illustrating a method 300 of biasing a substrate during plasma assisted processing, according to embodiments described herein. At 310, the method 300 includes electrically coupling a first DC power source to a chucking electrode embedded in a substrate support that is disposed on a support base, the substrate support and the support base forming a substrate support assembly, which is disposed in a processing volume of a processing chamber. The substrate support is formed of one or more layers of dielectric material and the chucking electrode is disposed on and/or embedded therein along a plane parallel to the substrate support surface. Typically, the substrate support is thermally coupled to the support base to enable heat transfer therebetween.

At 320, the method 300 includes connecting a second DC power source to the support base, where a plurality of conductive elements is electrically coupled to the support base, and where the plurality of conductive elements is disposed in the substrate support and extend from a surface thereof. The plurality of conductive elements is disposed through openings in the chucking electrode and are electrically isolated therefrom by the dielectric material of the substrate support disposed therebetween. The conductive elements may be conductive pins either fixedly coupled to the support base, or disposed on or coupled to a resilient member disposed in the support base. Herein, the resilient members are electrically conductive, and may be compressible springs.

At 330, the method includes electrically coupling a first DC power to a reference voltage contact of the second DC power source. Coupling the first DC power to the reference voltage contact of the second DC power source electrically floats the first DC power on a second DC power supplied by the second DC power source.

At 340, the method includes applying the first DC power from the first DC power source to the chucking electrode. Electrically floating the first DC power on a reference voltage contact of the second DC power source in activity 330 enables application of a constant potential difference between the substrate (biased by the second DC power) and the chucking electrode. The constant potential difference during application of the first DC power results in a constant clamping force between the substrate and the substrate support during pulsed DC biasing of the substrate. In one embodiment, the potential difference between the chucking electrode and the plurality of conductive pins is maintained at an essentially constant voltage between about 0V and about 5000 V, such as between about 500 V and about 4500 V, such as between about 1000 V and about 3000 V, for example about 2500 V.

At 350, the method 300 includes applying the second DC power from the second DC power source to the support base. Herein, applying the second DC power to the support base applies the power to the plurality of conductive elements electrically coupled thereto. Applying the second DC power to the conductive elements provides a DC bias to a substrate through direct contact therewith. In some embodiments, applying the second DC power comprises pulsing the second DC power by operating a switch disposed between the second DC power source and the support base. Typically, pulsing the second DC power comprises cyclically pulsing the second DC power at a frequency between about 10 Hz and about 100 kHz, such as between about 500 Hz and about 50 kHz, where the duty cycle of the cyclically pulsed second DC power is between about 10% and about 90%, such as between about 25% and about 75%, and where the pulse of the second DC power is between about 0 V and about −10 kV, such as between about −1 kV and about −5 kV.

In some embodiments, the method further comprises forming a plasma in the processing volume by flowing a processing gas into the processing volume and applying a power to an electrode facing the substrate support. The pulsed DC power applied to the plurality of conductive elements, and a substrate in direct contact therewith, provides a single potential between the substrate and the plasma that accelerates ions from the plasma towards the substrate, the accelerated ions having a narrow range of high energies and low angular distributions at a material surface of the substrate. The plasma may be formed prior to chucking the substrate or after chucking the substrate.

The plasma processing apparatus and methods described herein enable direct pulsed DC biasing of a substrate during plasma assisted processing that is compatible with use of an electrostatic clamping force. Pulsed DC biasing allows for increased control of ion energy and angular distribution at the substrate surface and in feature openings formed therein. This increased control is desirable at least in forming high aspect ratio features and/or other features requiring a straight etch profile, such as high aspect ratio etching in dielectric materials for memory devices, including non-volatile flash memory devices and dynamic random access memory devices, and in silicon etching for shallow trench isolation (STI) applications or to form silicon fins used in FinFET devices.

While the foregoing is directed to embodiments of the present disclosure, other and further embodiments of the disclosure may be devised without departing from the basic scope thereof, and the scope thereof is determined by the claims that follow.

The invention claimed is:

1. A processing method, comprising:
    electrostatically chucking a substrate to a substrate support by applying a first DC power from a first DC power source to a chucking electrode embedded in a dielectric material of the substrate support, wherein
        a surface of the substrate support and a surface of the substrate electrostatically chucked thereto define a plenum, and
        the substrate support is disposed in a processing volume of a processing chamber;
    delivering helium gas to the plenum; and
    biasing the substrate by applying a second DC power from a second DC power source to a plurality of conductive pins disposed in the substrate support and extending upwardly from a substrate supporting surface thereof, wherein the plurality of conductive pins are in direct contact with the substrate electrostatically chucked to the substrate support, and wherein the first DC power source is electrically coupled to a reference voltage contact of the second DC power source.

2. The method of claim 1, wherein applying the second DC power comprises pulsing the second DC power by operating a bias controller disposed between the second DC power source and the plurality of conductive pins.

3. The method of claim 2, wherein the substrate support is disposed on an electrically conductive support base, and wherein individual ones of the plurality of conductive pins are electrically coupled to the support base.

4. The method of claim 2, wherein pulsing the second DC power comprises cyclically pulsing the second DC power at a frequency between about 10 Hz and about 100 kHz.

5. The method of claim 4, wherein a duty cycle of the cyclically pulsed second DC power is between about 10% and about 90%.

6. The method of claim 2, further comprising forming a plasma in the processing volume.

7. The method of claim 6, wherein forming the plasma comprises:
flowing a processing gas into the processing volume; and
applying a power to a plasma electrode facing the substrate support.

8. The method of claim 7, wherein pulsing the second DC power comprises cyclically pulsing the second DC power at a frequency between about 10 Hz and about 100 kHz.

9. The method of claim 8, wherein a duty cycle of the cyclically pulsed second DC power is between about 10% and about 90%.

10. The method of claim 9, wherein a potential difference between the chucking electrode and the substrate in contact with the plurality of conductive pins is about constant while cyclically pulsing the second DC power.

11. The method of claim 10, wherein a chucking force on the substrate is about constant while cyclically pulsing the second DC power.

12. A processing method, comprising:
forming a plasma in a processing volume of a processing chamber by flowing a gas into the processing volume and applying a plasma power to a plasma electrode facing a substrate support;
electrostatically chucking a substrate to a substrate support by applying a first DC power from a first DC power source to a chucking electrode embedded in a dielectric material of the substrate support, wherein
a surface of the substrate support and a surface of the substrate electrostatically chucked thereto define a plenum,
the substrate support is disposed in the processing volume, and
the substrate support is disposed on a support base to form a substrate support assembly;
delivering helium gas to the plenum; and
biasing the substrate by applying a second DC power from a second DC power source to a plurality of conductive pins disposed in the substrate support and extending upwardly from a substrate supporting surface thereof, wherein
the plurality of conductive pins are in direct contact with the substrate electrostatically to the substrate support,
the first DC power source is electrically coupled to a reference voltage contact of the second DC power source, and
the second DC power comprises a pulsed DC power having a frequency between about 10 Hz and about 100 kHz.

13. The method of claim 12, wherein applying the second DC power comprises cyclically pulsing the second DC power at a duty cycle between about 10% and about 90%.

14. The method of claim 13, wherein a potential difference between the chucking electrode and the substrate is about constant while applying the second DC power.

15. The method of claim 13, wherein the support base is electrically conductive and wherein individual ones of the plurality of conductive pins are electrically coupled to the support base.

16. A processing method, comprising:
positioning a substrate on a surface of a substrate support disposed in a processing volume of a processing chamber, the substrate support comprising a chucking electrode embedded in a layer of dielectric material and a plurality of conductive pins individually disposed through the dielectric material to make direct contact with the substrate during processing thereof;
flowing a processing gas into the processing volume;
forming a plasma of the processing gas;
electrostatically chucking the substrate to the substrate support by applying a first DC power from a first DC power source to the chucking electrode, wherein
the first DC power source is electrically coupled between the chucking electrode and a reference voltage contact of a second DC power source,
the second DC power source is electrically coupled to the plurality of conductive pins, and
a surface of the substrate support and a surface of the substrate electrostatically chucked thereto define a plenum;
delivering helium gas to the plenum; and
biasing the substrate by applying a second DC power from the second DC power source to the plurality of conductive pins.

17. The method of claim 16, wherein biasing the substrate comprises pulsing the second DC power by operating a bias controller disposed between the second DC power source and the plurality of conductive pins.

18. The method of claim 17, wherein the first DC power source electrically floats on a pulsed DC voltage from the bias controller.

19. The method of claim 3, wherein
individual ones of the plurality of conductive pins are disposed on the electrically conductive support base,
individual ones of the plurality of conductive pins are disposed through corresponding openings in the chucking electrode, and
individual ones of the plurality of conductive pins are electrically isolated from the chucking electrode by dielectric material of the substrate support disposed there between.

* * * * *